(12) United States Patent
Song et al.

(10) Patent No.: US 10,488,452 B2
(45) Date of Patent: Nov. 26, 2019

(54) TEST BOARD FOR SEMICONDUCTOR DEVICE AND TEST SYSTEM INCLUDING THE SAME

(71) Applicant: Samsung Electronics Co., Ltd., Suwon-si (KR)

(72) Inventors: Sung Jun Song, Hwaseong-si (KR); Young Min Kim, Suwon-si (KR); Chang Su Kim, Hwaseong-si (KR); Han Gu Kim, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 385 days.

(21) Appl. No.: 15/379,951

(22) Filed: Dec. 15, 2016

(65) Prior Publication Data

US 2017/0176508 A1    Jun. 22, 2017

(30) Foreign Application Priority Data

Dec. 18, 2015 (KR) .................. 10-2015-0181754

(51) Int. Cl.
*G01R 31/00*  (2006.01)
*G01R 1/04*  (2006.01)

(52) U.S. Cl.
CPC ......... *G01R 31/002* (2013.01); *G01R 1/0416* (2013.01)

(58) Field of Classification Search
CPC ............ G01R 31/2868; G01R 31/2874; G01R 31/2889; G01R 31/311; G01R 31/318513
See application file for complete search history.

(56) References Cited

U.S. PATENT DOCUMENTS

| 5,536,969 | A | * | 7/1996 | Matsuoka | ......... H01L 21/67144 |
|---|---|---|---|---|---|
| | | | | | 257/666 |
| 7,512,916 | B2 | | 3/2009 | Hayashi | |
| 8,230,373 | B2 | | 7/2012 | Kobayashi et al. | |
| 8,819,614 | B2 | | 8/2014 | Hayashi | |
| 8,928,341 | B2 | | 1/2015 | Lee et al. | |
| 2013/0080136 | A1 | | 3/2013 | Kimura | |
| 2014/0107961 | A1 | | 4/2014 | Chen et al. | |
| 2014/0111242 | A1 | * | 4/2014 | Xie | .................... G01R 31/2853 |
| | | | | | 324/762.02 |

FOREIGN PATENT DOCUMENTS

| JP | 2006-337029 | 12/2006 |
|---|---|---|
| JP | 2007-232615 | 9/2007 |
| JP | 2008-204127 | 9/2008 |
| JP | 5129085 | 1/2013 |

* cited by examiner

*Primary Examiner* — Tung X Nguyen
(74) *Attorney, Agent, or Firm* — Muir Patent Law, PLLC

(57) ABSTRACT

A test board for a semiconductor device and a test board including the same are provided. A test board includes a substrate, a mounting pad which is formed on the substrate and on which a semiconductor chip is mounted and a test terminal group arranged on the substrate to be spaced apart from the mounting pad and electrically connected to the semiconductor chip by a pattern arranged on the substrate, wherein the semiconductor chip includes a first terminal and a second terminal for inputting/outputting signals, the test terminal group includes a first test terminal electrically connected to the first terminal and a second test terminal electrically connected to the second terminal, a first voltage is applied to the first terminal and the second terminal, and a stress signal that is caused by a second voltage is applied to the first test terminal.

17 Claims, 12 Drawing Sheets

1200

1300

1400

TEST BOARD FOR SEMICONDUCTOR DEVICE AND TEST SYSTEM INCLUDING THE SAME

CROSS-REFERENCE TO RELATED APPLICATIONS

This application is based on and claims priority under 35 U.S.C. 119 from Korean Patent Application No. 10-2015-0181754, filed on Dec. 18, 2015 in the Korean Intellectual Property Office, the disclosure of which is incorporated herein in its entirety by reference.

BACKGROUND

1. Field

The present disclosure relates to a test board for a semiconductor device and a test system including the same.

2. Description of the Prior Art

A DDI (Display Driver IC) is a semiconductor device for driving a display panel that is mounted on an electronic device. With the high performance of an electronic device, resolution of a display panel that is mounted on the electronic device has been heightened day by day, and complexity of a DDI for driving the display panel has been increased.

If an electrostatic discharge (ESD) or an electrical overstress (EOS) phenomenon occurs and transfers to the DDI in a state where the DDI is mounted on the electronic device, operational reliability of the DDI and the electronic device may deteriorate due to overcurrent that flows through corresponding circuits. ESD and EOS are different from each other in a transient electrical pulse width. In particular, the ESD is discharge phenomenon in which a finite amount of positive charge may rapidly move between two objects having different potentials, and the discharge may be made during several hundred picoseconds (ps) to a few microseconds (p). Meanwhile, the EOS is an electrical shock such as an abnormal over-current or over-voltage due to leakage current and voltage of equipment which uses a power source, and the EOS may be produced during a few nanoseconds (ns) to a few milliseconds (ms).

SUMMARY

Defect occurrence due to an ESD stress of the DDI as described above may decrease operational reliability of the DDI on the point that it is not easy to reproduce the same defect.

One subject to be solved by the present disclosure is to provide a test board that can reproduce the same DDI defect using a predetermined stress model.

Another subject to be solved by the present disclosure is to provide a test system that can reproduce the same DDI defect using a predetermined stress model.

Additional advantages, subjects, and features of the disclosure will be set forth in part in the description which follows and in part will become apparent to those having ordinary skill in the art upon examination of the following or may be learned from practice of the disclosure.

In accordance with an aspect of the present disclosure, a test board for a semiconductor device includes: a substrate; a mounting pad which is formed on the substrate and on which a semiconductor chip is mounted; and a test terminal group arranged on the substrate to be spaced apart from the mounting pad and electrically connected to the semiconductor chip by a pattern arranged on the substrate, wherein: the semiconductor chip includes a first terminal and a second terminal configured to input/output signals, the test terminal group includes a first test terminal electrically connected to the first terminal and a second test terminal electrically connected to the second terminal, both the first terminal and the second terminal are configured to receive a first voltage, and the first test terminal is configured to receive a stress signal that is caused by a second voltage.

In accordance with another aspect of the present disclosure, a test system of a semiconductor device includes: an electrostatic discharge (ESD) simulator including an RC equivalent circuit model to generate a stress signal; a test board configured to receive the stress signal from the ESD simulator; and an analyzer configured to monitor the test board, wherein the test board includes: a substrate; a mounting pad on which a semiconductor chip that includes a first terminal and a second terminal is mounted; and a first test terminal and a second test terminal arranged on the substrate and respectively connected to the first terminal and the second terminal of the semiconductor chip, wherein both the first terminal and the second terminal are configured to receive a ground voltage, and the semiconductor chip is configured to receive the stress signal through the first test terminal.

In accordance with another aspect of the present disclosure, a test method using a test board of a semiconductor device includes: mounting a semiconductor chip on a test board, the semiconductor chip including a first terminal and a second terminal configured to input/output signals and the test board including a substrate in which a test terminal group are arranged; electrically connecting a first test terminal included in the test terminal group to the first terminal of the semiconductor chip; electrically connecting a second test terminal included in the test terminal group to the second terminal of the semiconductor chip; applying a first voltage to the first terminal and the second terminal; applying a stress signal that is caused by a second voltage to the first test terminal; and monitoring whether current that is output to the second terminal is increased by the stress signal.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF THE EMBODIMENTS

Figure 1:
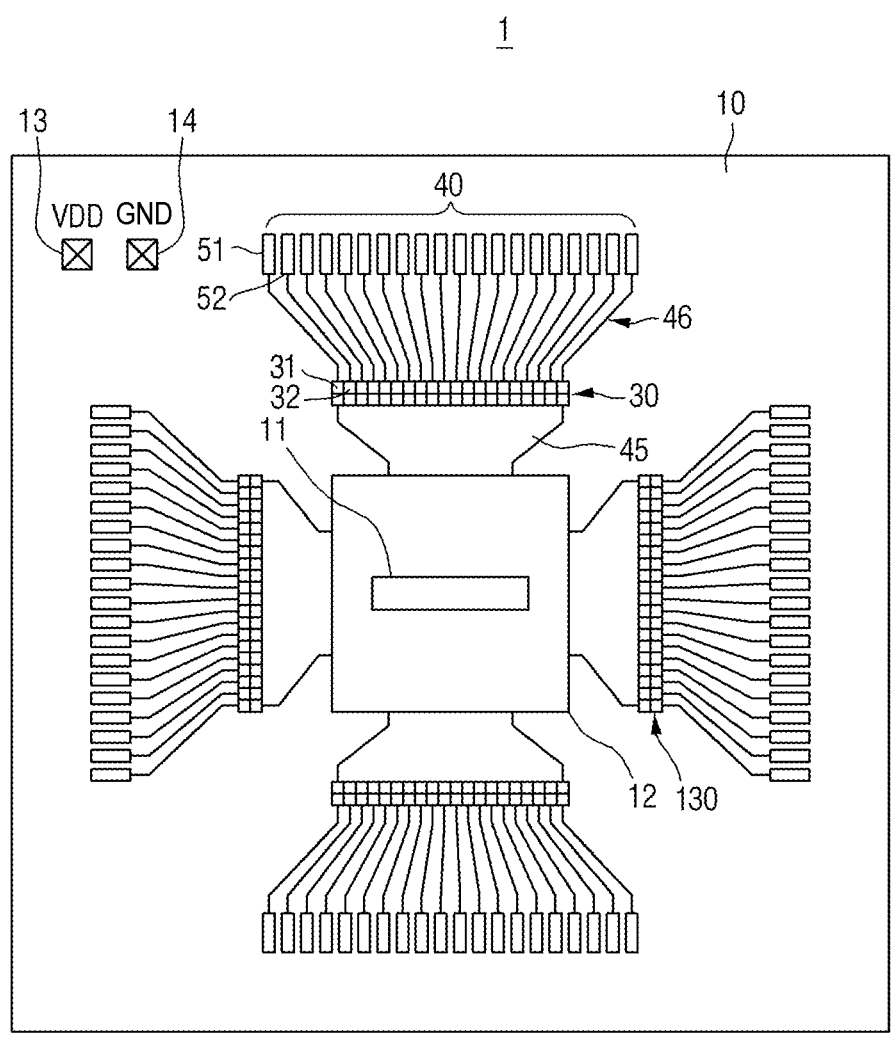
FIG. 1 is a view of a test board for a semiconductor device according to an exemplary embodiment of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). [Alt: The term "contact," as used herein, refers to a direct connection (i.e., touching) unless the context indicates otherwise.]

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other may be electrically connected through one or more passive elements, such as, for example, wires, pads, internal electrical lines, through vias, etc. Directly electrically connected components would not include components electrically connected through active elements that may disconnect the electrical connection, such as transistors or diodes. Directly electrically connected elements may be directly physically connected and directly electrically connected.

Hereinafter, preferred embodiments of the present disclosure will be described with reference to the accompanying drawings.

FIG. 1 is a view of a test board for a semiconductor device according to an exemplary embodiment of the present disclosure.

Referring to FIG. 1, a test board 1 may include a substrate 10, a mounting pad 12, a test pin group 30, a switch group 40, a first terminal VDD, and a second terminal GND.

A semiconductor chip 11 may be mounted on the mounting pad 12. In some embodiments of the present disclosure, the semiconductor chip 11 may be a DDI chip.

The semiconductor chip 11 may be mounted on the mounting pad 12 in a state where the semiconductor chip 11 is mounted on a flexible circuit board such as a COF (Chip On Film) or a board such as COG (Chip On Glass).

Hereinafter, the interior of the semiconductor chip 11 will be described with reference to FIGS. 2A and 2B.

Figure 2A:
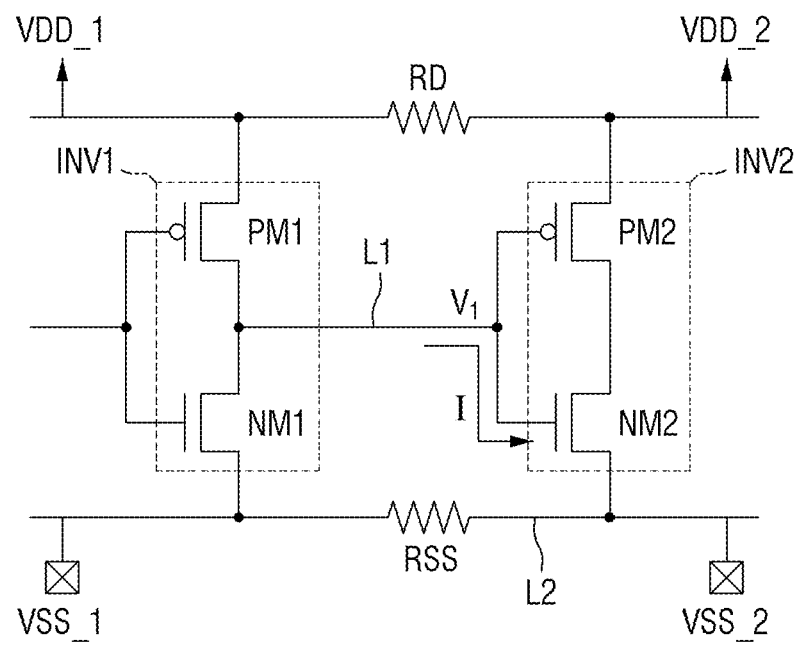
FIGS. 2A and 2B are a circuit diagram and a cross-sectional view explaining an internal circuit of the semiconductor device of FIG. 1 according to an exemplary embodiment.
Figure 2B:
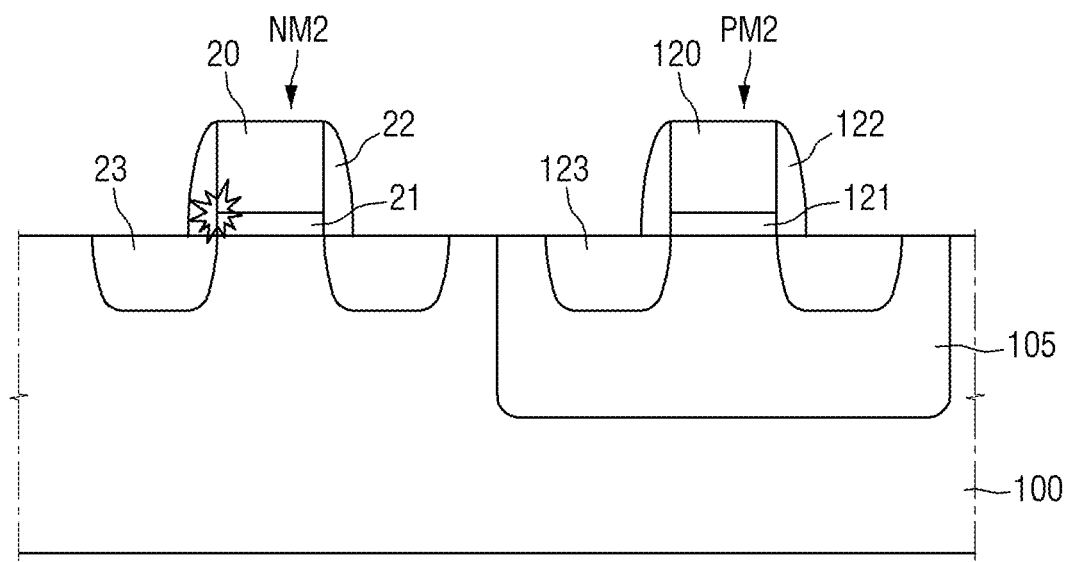

FIGS. 2A and 2B are a circuit diagram and a cross-sectional view explaining an internal circuit of the semiconductor device of FIG. 1 according to exemplary embodiments.

Referring to FIG. 2A, the semiconductor chip 11 may include a first pin VSS_1 and a second pin VSS_2. The same reference voltage may be applied to the first pin VSS_1 and the second pin VSS_2. The voltage that is applied to the first pin VSS_1 and the second pin VSS_2 may be a ground voltage. It will be appreciated that the term "pin" as used herein generically refers to a terminal of a semiconductor chip and need not constitute a physical prong, but may be a pad, solder bump or other type of electrical terminal.

The semiconductor chip 11 may include a first inverter connected to the first pin VSS_1 and a second inverter connected to the second pin VSS_2. The second inverter may receive a signal that is output from the first inverter.

The first inverter INV1 may include a first PMOS transistor PM1 and a first NMOS transistor NM1.

The second inverter INV2 may include a second PMOS transistor PM2 and a second NMOS transistor NM2.

Source terminals of the first PMOS transistor PM1 and the second PMOS transistor PM2 may be connected to a first power pin VDD_1 (also may be referred to as a first power terminal VDD_1) and a second power pin VDD_2 (also may be referred to as a second power terminal VDD_2), respectively. The first power pin VDD_1 and the second power pin VDD_2 may provide supply voltages to the first inverter INV1 and the second inverter INV2, respectively. A first resistor RD may be provided between the source terminals of the first PMOS transistor PM1 and the second PMOS transistor PM2.

Source terminals of the first NMOS transistor NM1 and the second NMOS transistor NM2 may be connected to the first pin VSS_1 and the second pin VSS_2, respectively. A second resistor RSS may be provided between the source terminals of the first NMOS transistor NM1 and the second NMOS transistor NM2.

The substrate 100 may be made of, for example, bulk silicon or SOI (Silicon-On-Insulator). Unlike this, the semiconductor substrate 100 may be a silicon substrate, or may include another material, for example, silicon germanium, indium antimonide, lead telluride, indium arsenide, indium phosphide, gallium arsenide, or gallium antimonide. Hereinafter, explanation will be made on the assumption that the substrate 100 is a silicon substrate.

Referring to FIG. 2B, in some embodiments, the second NMOS transistor NM2 may include a first gate electrode 20, a first gate insulating layer 21, a first gate spacer 22, and a first source/drain 23.

The second PMOS transistor PM2 may include a second gate electrode 120, a second gate insulating layer 121, a second gate spacer 122, and a second source/drain 123.

The second PMOS transistor PM2 may be formed on an n-well 105 that is formed on the substrate 100.

In some embodiments, electrostatic discharge (ESD) may be input to the semiconductor chip 11 through the first pin VSS_1. The ESD that is input to the semiconductor chip 11 may be discharged out of the chip through the second pin VSS_2 that is connected to the same ground voltage. However, due to impedance imbalance between a ground line L2 and a connection line L1, the voltage on the connection line L1 may be increased over a stress voltage V1. In some embodiments, the connection line L1 connects the first inverter INV1 and the second inverter INV2 of the semiconductor chip 11 to each other. For example, one end of the connection line L1 is connected to drain terminals of the first PMOS transistor PM1 and the first NMOS transistor NM1 of the first inverter INV1 and the opposite end of the connection line L1 is connected to gate terminals of the second PMOS transistor PM2 and the second NMOS transistor NM2 of the second inerter INV2. In some embodiments, the ground line L2 connects the first pin VSS_1 and the second pin VSS_2 of the semiconductor chip 11 to each other. One end of the ground line L2 is connected to the source terminal of the first NMOS transistor NM1 and the opposite end of the ground terminal is connected to the source terminal of the second NMOS transistor NM2.

The stress voltage V1 may be, for example, a high voltage having a value that is equal to or higher than 15 kV. Accordingly, due to the voltage difference between the connection line L1 and the second pin VSS_2, which occurs due to the stress voltage V1, overcurrent may flow to the second NMOS transistor NM2.

That is, if an excessive voltage difference occurs between the first gate electrode 20 of the second NMOS transistor NM2 and the first source/drain 23, an FN (Fowler-Nordheim) tunneling phenomenon (e.g., a process whereby electrons tunnel through a barrier in the presence of a high electric field) may occur in the first gate insulating layer 21, and thus stress current I may flow through the first gate insulating layer 21.

If the stress current I flows to the second pin VSS_2 through the second NMOS transistor NM2, the temperature of the first gate insulating layer 21 may be increased. Due to the high temperature, a gate oxide rupture phenomenon may occur in the first gate insulating layer 21.

Using the test board of the semiconductor device according to an embodiment of the present disclosure, a test for reproducing the gate oxide rupture phenomenon that is caused by the stress current I that flows through the first gate insulating layer 21 may be performed.

For example, using the test board of the semiconductor device according to an exemplary embodiment of the present disclosure, it may be tested whether the impedance imbalance between the connection line L1 and the ground line L2 in the semiconductor chip 11 (in FIG. 1) has occurred.

Referring again to FIG. 1, the test board 1 may include a first test pin group 30 and a second test pin group 130 that are connected to the semiconductor chip 11 through a first pattern 45 that is formed on the substrate 10.

The first test pin group 30 may include a first test pin 31 and a second test pin 32. The first pin VSS_1 (in FIG. 2A) of the semiconductor chip 11 may be electrically connected to the first test pin 31 through the first pattern 45 that is formed on the substrate 10. In the same manner, the second pin VSS_2 (in FIG. 2A) may also be electrically connected to the second test pin 32 through the first pattern 45.

As illustrated in FIG. 1, the first test pin 31 and the second test pin 32 may be test pins that are adjacent to each other. However, the present disclosure is not limited thereto, and the first test pin 31 and the second test pin 32 may also be test pins that are spaced apart from each other. Further, the first test pin 31 may belong to the first test pin group 30, and the second test pin 32 may belong to the second test pin group 130.

As illustrated in FIG. 1, the first test pin group 30 and the second test pin group 130 may be arranged to surround the semiconductor chip 11 and the mounting pad 12 together with other test pin groups.

The first and second test pins 31 and 32 may receive signals from an outside. For example, in a method for testing a semiconductor device according to an embodiment of the present disclosure, a stress signal may be applied to the semiconductor chip 11 through the first or second test pin 31 or 32.

The switch group 40 may be electrically connected to the respective pins included in the first and second test pin groups 30 and 130 through a second pattern 46.

The switch group 40 may include first and second switches 51 and 52. The first and second switches 51 and 52 may be electrically connected to the first and second pins 31 and 32 through the second pattern 46. In some embodiments of the present disclosure, the first and second switches 51 and 52 may be arranged to be adjacent to each other as illustrated in FIG. 1. However, the present disclosure is not limited thereto, and another switch may be arranged between the first and second switches 51 and 52.

The first switch 51 may connect the first pin 31 to the first terminal 13 or the second terminal 14. That is, if the first switch 51 is set in a first mode, the first pin 31 may be connected to the first terminal 13. In contrast, if the first switch 51 is set in a second mode, the first pin 31 may be connected to the second terminal 14.

The supply voltage may be applied to the first terminal 13, and the ground voltage may be applied to the second terminal 14.

Accordingly, through the switching operations of the switches included in the switch group 40, the supply voltage or the ground voltage may be applied to the respective pins of the semiconductor chip 11. In the test board of the semiconductor device according to an embodiment of the present disclosure, it is assumed that the first pin VSS_1 and the second pin VSS_2 are tested through application of the ground voltage thereto, but the disclosure is not limited thereto. For example, the first pin VSS_1 and the second pin VSS_2 may also be tested through application of the supply voltage thereto.

Figure 3:
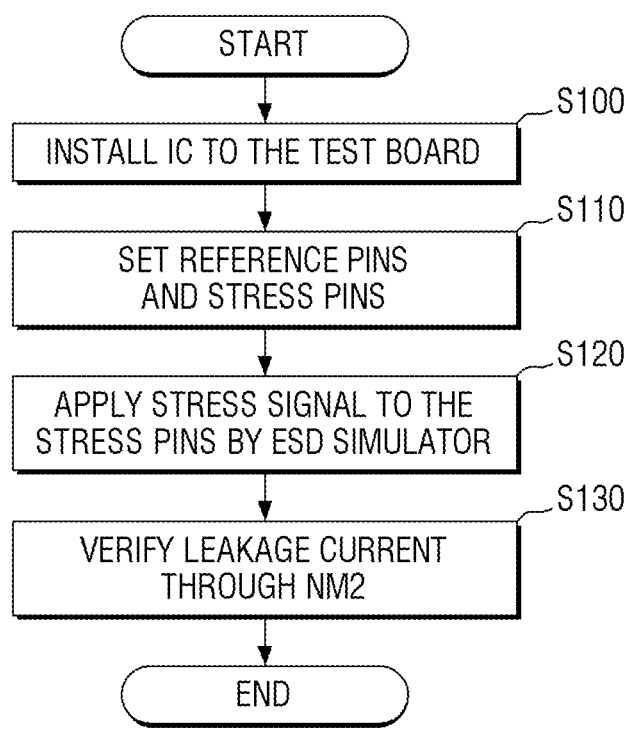
FIG. 3 is a flowchart explaining a test using a test board for a semiconductor device according to an exemplary embodiment of the present disclosure.

FIG. 3 is a flowchart explaining a test using a test board for a semiconductor device according to an exemplary embodiment of the present disclosure.

Referring to FIGS. 1 to 3, a test method using a test board of a semiconductor device according to an embodiment of the present disclosure includes mounting a semiconductor chip on a test board (S100), setting reference pins and stress pins of the semiconductor chip (S110), applying a stress signal to the stress pins using an ESD simulator (S120), and verifying leakage current that flows through a second NMOS transistor (S130).

First, in order to perform an ESD test for the semiconductor chip 11, the semiconductor chip 11 is mounted on the test board 1 (S100). The semiconductor chip 11 may be mounted on the mounting pad 12 that is arranged on the substrate 10.

Next, the reference pins and the stress pins of the semiconductor chip 11 are set. The reference pins of the semiconductor chip 11 are pins to which the ground voltage is applied, and the stress pins are pins to which the stress signal is applied.

In some embodiments of the present disclosure, the first pin VSS_1 and the second pin VSS_2 may be set as the reference pins, and the ground voltage may be applied thereto.

Application of the ground voltage to the first pin VSS_1 may be achieved by connecting the first switch 51 that is connected to the first test pin 31 to the second terminal 14. In the same manner, application of the ground voltage to the second pin VSS_2 may be achieved by connecting the second switch 52 that is connected to the second test pin 32 to the second terminal 14.

That is, setting of the first pin VSS_1 and the second pin VSS_2 as the reference pins may be achieved by connecting the first and second switches 51 and 52 to the second terminal 14.

As described hereinafter, since the stress signal is applied to the semiconductor chip 11 through the first test pin 31, the first pin VSS_1 that is connected to the first test pin 31 may be set as the stress pin.

The stress signal is applied to the stress pin using the ESD simulator (S120).

The stress signal that is output from the ESD simulator may be applied to the test board 1 through the first test pin 31.

Figure 4:
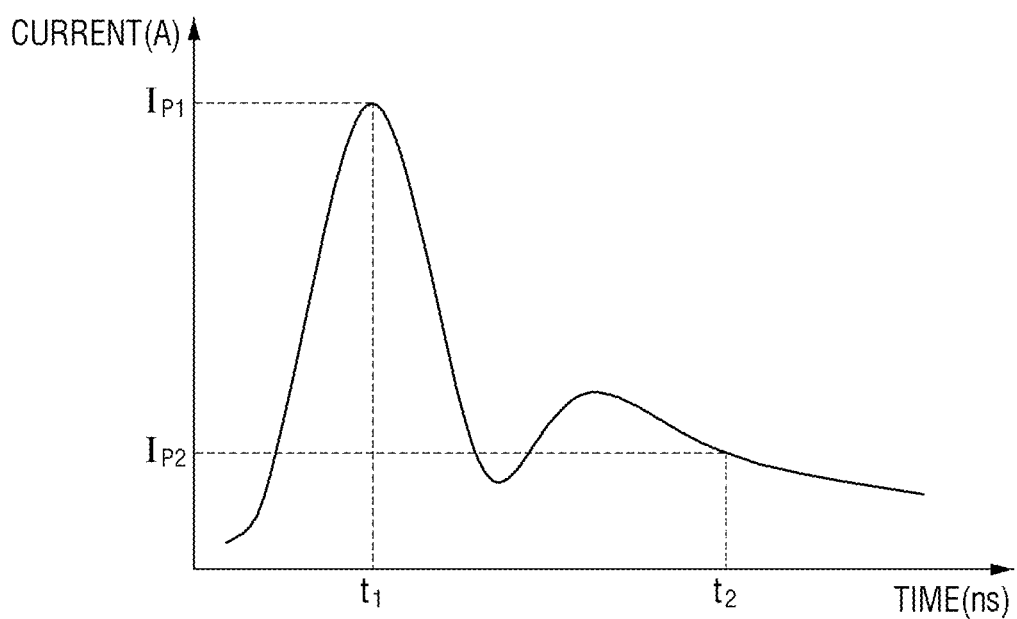
FIG. 4 is a graph illustrating a waveform of a stress signal according to an exemplary embodiment of the present disclosure.

FIG. 4 is a graph illustrating a waveform of a stress signal according to an exemplary embodiment of the present disclosure.

In some embodiments of the present disclosure, the stress signal that is applied to the test board 1 may be in the form as illustrated in FIG. 4.

In FIG. 4, current Ip1 at a first peak of the stress signal may be 7.5 A, a rising time t1 may be 0.8 ns, and a second peak current Ip2 at 20 ns (t2) may be 1 A or less.

If the stress signal is applied to the semiconductor chip 11 in the case where the impedance between the connection line L1 and the ground line L2 becomes imbalanced, excessive voltage difference may be applied to the second NMOS transistor NM2, and thus the defect of the gate oxide rupture as described above may be reproduced.

In some embodiments of the present disclosure, errors of the current Ip1 at the first peak and the rising time t1 may be ±15% and ±5%, respectively.

Last, the leakage current that flows through the second NMOS transistor NM2 is measured (S130). The measurement of the leakage current that flows through the second NMOS transistor NM2 may be measurement of current that is output to the second pin VSS_2.

The ESD test of the semiconductor chip 11 using the test board 1 according to an embodiment of the present disclosure may be performed at component levels before the semiconductor chip 11 is mounted on an electronic product.

That is, in a state where the semiconductor chip 11 is mounted on the test board 1, the ground voltage is applied to the first pin VSS_1 and the second pin VSS_2 and the stress signal is applied to the first pin VSS_1 that is set as the reference pin at the same time. Accordingly, the defect that occurs due to the stress signal according to an embodiment of the present disclosure may have strong cross correlation to the defect that occurs in the case where the semiconductor chip 11 is mounted on the electronic product to be operated.

Figure 5:
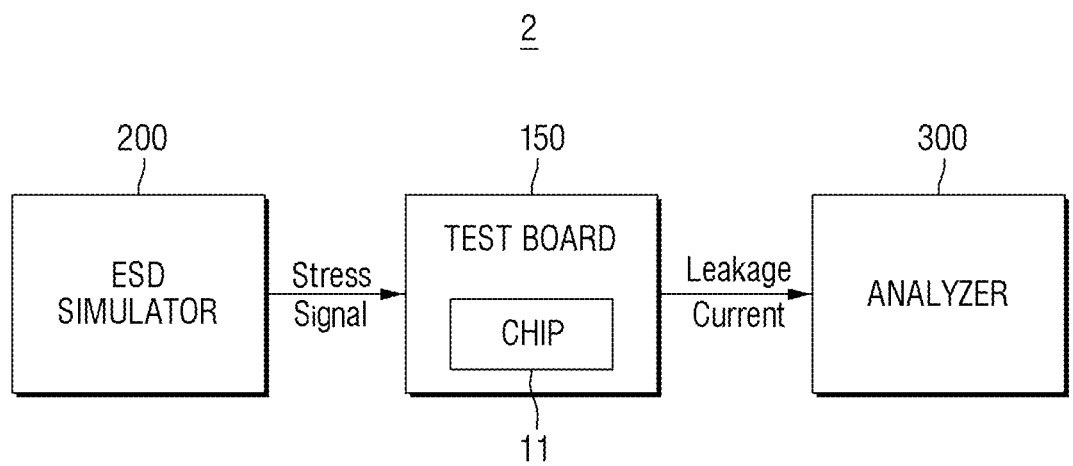
FIG. 5 is a diagram of a test system for a semiconductor device according to an exemplary embodiment of the present disclosure.

FIG. 5 is a diagram of a test system for a semiconductor device according to an exemplary embodiment of the present disclosure.

Referring to FIG. 5, a test system 2 may include a test board 150, an ESD simulator 200, and an analyzer 300. Since the configuration of the test board 150 is similar to the test board 1 as described above, the duplicate explanation thereof will be omitted.

The ESD simulator 200 may provide the stress signal to the semiconductor chip 11 through test pins on the test board 150.

The ESD simulator 200 may include, for example, an ESD gun.

Figure 6:
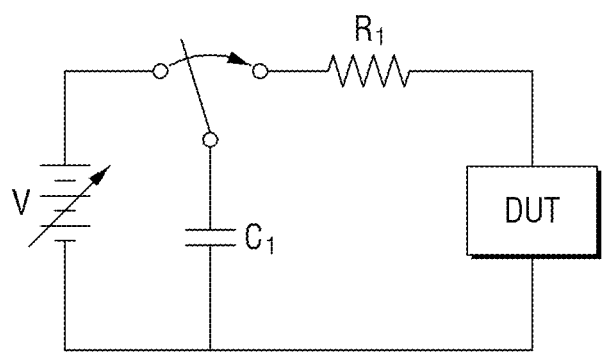
FIG. 6 is a diagram of an equivalent circuit model of a test board according to an exemplary embodiment of the present disclosure.

FIG. 6 is a circuit diagram of an RC equivalent circuit between the ESD simulator 200 and the test board 150 of FIG. 5.

Referring to FIG. 6, the ESD simulator 200 may set not only the waveform of the stress signal but also parameters of a resistor R1 and a capacitor C1 in the RC equivalent circuit that is formed by the ESD simulator 200 and the test board 150 as the test setup.

In some embodiments of the present disclosure, the resistor R1 may be set to 5 to 10 kΩ, and the capacitor C1 may be set to 100 to 150 pF, but the disclosure is not limited thereto.

Figure 7:
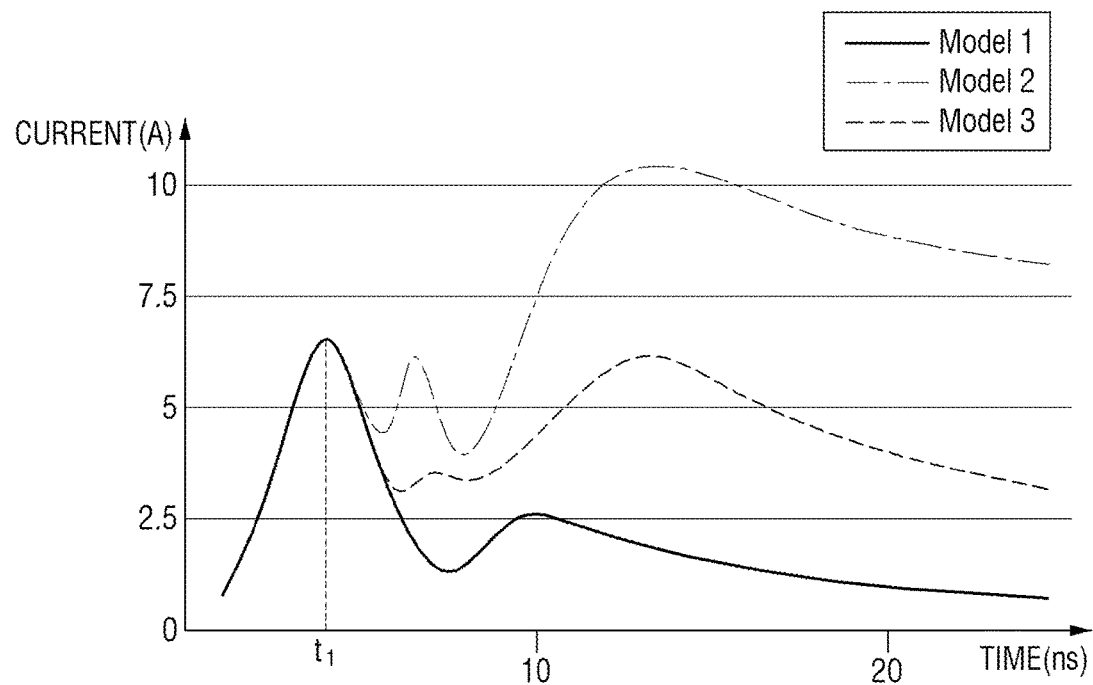
FIGS. 7 and 8 are graphs explaining comparison of parameter setting of an ESD simulator according to an exemplary embodiment of the present disclosure with other settings.
Figure 8:
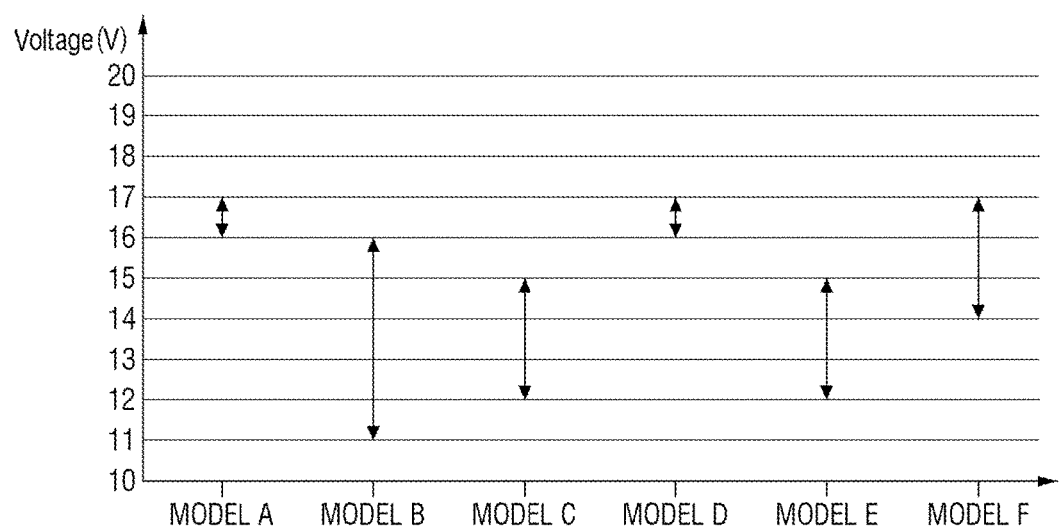

FIGS. 7 and 8 are graphs explaining comparison of parameter setting of an ESD simulator 200 according to an exemplary embodiment of the present disclosure with various settings of the resistor R1 and the capacitor C1.

In FIG. 7, an output voltage of a stress signal output of the ESD was set to 2 kV. Further, the capacitor C1 of the RC equivalent circuit was set to 100 to 150 pF, and parameters of the resistor R1 were set to three kinds Model 1 to Model 3. Under the above-described settings, current of the stress signal that is applied to the test board 150 was measured.

Here, the parameter setting values of Model 1 to Model 3 are as follows.

|         | R1(Ω) | C1(pF)  |
|---------|-------|---------|
| Model 1 | 10k   | 100~150 |
| Model 2 | 0     | 100~150 |
| Model 3 | 330   | 100~150 |

First, in the case of Model 1, the current of the stress signal satisfied the shape of the stress signal as described above with reference to FIG. 4, that is, the first peak current, the rising time t1, and the second peak current at 20 ns. For example, in the case of Model 1, the value of current of the stress signal at t1 (e.g., at 0.8 ns) was about 7 A and the value of current of the stress signal at 20 ns was about 1 A. In contrast, as illustrated in FIG. 7, in the case of the settings of Model 2, the value of current of the stress signal at t1 (e.g., at 0.8 ns) was about 7 A, but the value of current of the stress signal at 20 ns was about 4 A and in the case of the settings of Model 3, the value of current of the stress signal at t1 (e.g., at 0.8 ns) was about 7 A, but the value of current of the stress signal at 20 ns was about 9 A. Thus, in the case of the settings of Model 2 and Model 3, the current of the stress signal was measured to exceed the required amount of the second peak current at 20 ns. Accordingly, the results obtained by performing the tests as illustrated in FIG. 7 indicate that the stress signal that is required by the parameters of the resistor R1 (e.g., 10K Ω) and the capacitor C1 (e.g., 100~150 pF) of Model 1 according to an embodiment of the present disclosure can be applied to the test board 1.

Referring to FIG. 8, deviations of output voltages of stress signals according to respective models Model A to Model F are illustrated. The settings of the resistor R1 and the capacitor C1 for the respective models are as follows.

|  | Model A | Model B | Model C | Model D | Model E | Model F |
|---|---|---|---|---|---|---|
| R1 (Ω) | 10k | 330 | 330 | 10k | 330 | 10k |
| C1 (pF) | 100 | 150 | 100 | 150 | 400 | 400 |

As illustrated, the output voltage that is measured in the settings of Model A and Model D has a range of about 16 kV to about 17 kV. In contrast, in the case of other models, i.e., Model B, Model C, Model E, and Model F, the ranges of the output voltage appear about 11 kV to about 16 kV, about 12 kV to about 15 kV, and about 14 kV to about 17 kV. As described above, it can be concluded that the deviations of the output voltages of Model A and Model B are relatively smaller than those of Model B, Model C, Model E, and Model F.

As the deviation of the output voltage becomes smaller, the reproducibility of the test of the semiconductor device according to an embodiment of the present disclosure can be heightened. That is, in the case where the value of the resistor R1 is set to 10 kΩ and the value of the capacitor C1 is set to 100 to 150 pF, the reproducibility of the test of the semiconductor device according to an embodiment of the present disclosure can be heightened.

As the result of the test that is performed by the test system of the semiconductor device according to an embodiment of the present disclosure, the defect of the gate oxide rupture in the semiconductor chip 11 that may occur due to the ESD may be verified with high reproducibility. Accordingly, the operation reliability of the semiconductor chip 11 that is mounted on the electronic product can be heightened.

Figure 9:
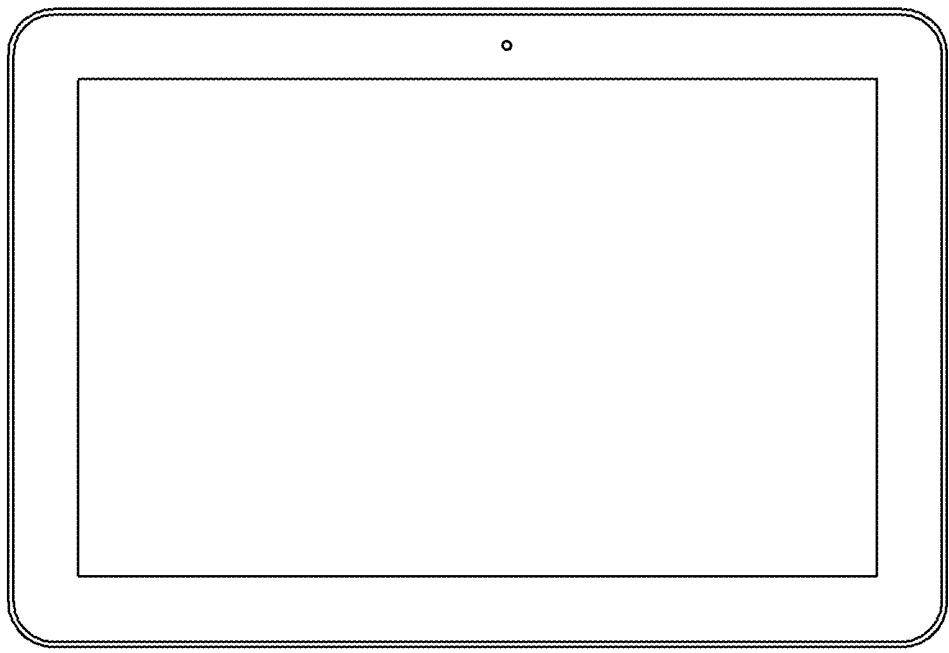
FIGS. 9 to 11 are views of exemplary semiconductor systems to which a semiconductor chip of which a test has been performed according to some exemplary embodiments of the present disclosure can be applied.
Figure 10:
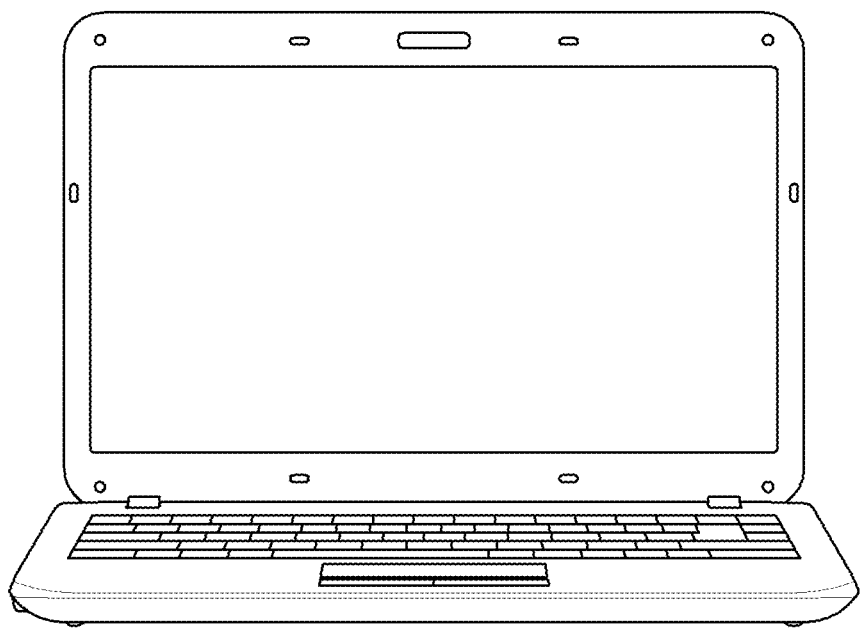
Figure 11:
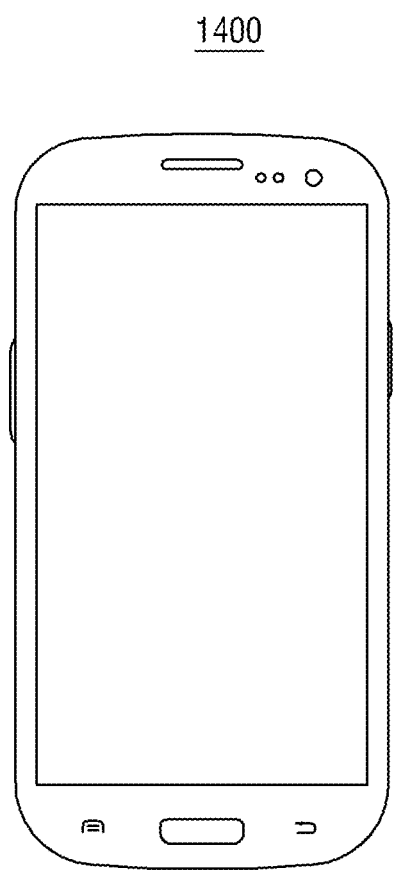

FIGS. 9 to 11 are views of exemplary semiconductor systems to which a semiconductor chip of which a test has been performed according to some exemplary embodiments of the present disclosure can be applied.

FIG. 9 illustrates a tablet PC 1200, FIG. 10 illustrates a notebook computer 1300, and FIG. 11 illustrates a smart phone 1400. At least one of processors according to an exemplary embodiment of the present disclosure can be used in the tablet PC 1200, the notebook computer 1300, and the smart phone 1400 as described above.

Further, it is apparent to those skilled in the art that the semiconductor device fabricated according to some embodiments of the present disclosure can also be applied to other non-exemplified integrated circuit devices. As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Although the tablet PC 1200, the notebook computer 1300, and the smart phone 1400 are described as examples of the semiconductor system according to this embodiment, the examples of the semiconductor system according to this embodiment are not limited thereto.

In some embodiments of the present disclosure, the semiconductor system may be implemented by a computer, a UMPC (Ultra Mobile PC), a work station, a net-book, a PDA (Personal Digital Assistants), a portable computer, a wireless phone, a mobile phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, or a digital video player.

The embodiments of the present disclosure have been described with reference to the attached drawings, but it may be understood by one of ordinary skill in the art that the present disclosure may be performed one of ordinary skill in the art in other specific forms without changing the technical concept or essential features of the present disclosure. Further, the above-described embodiments are merely examples and do not limit the scope of the rights of the present disclosure.

What is claimed is:
1. A test board for a semiconductor device, comprising:
a substrate;
a mounting pad which is formed on the substrate and on which a semiconductor chip is mounted;
a test terminal group arranged on the substrate to be spaced apart from the mounting pad and electrically connected to the semiconductor chip by a pattern arranged on the substrate,
wherein:
the semiconductor chip includes a first terminal and a second terminal configured to input/output signals,
the test terminal group includes a first test terminal electrically connected to the first terminal and a second test terminal electrically connected to the second terminal,
both the first terminal and the second terminal are configured to receive a first voltage,
the first test terminal is configured to receive a stress signal that is caused by a second voltage, and the test board further includes a first switch electrically connected to the first test terminal and a second switch electrically connected to the second test terminal, a ground terminal connected to a ground voltage, and a power terminal connected to a supply voltage.

2. The test board of claim 1, wherein the stress signal has a first peak current having a value of 7.5 A at 0.8 ns, and a second peak current having a value equal to or smaller than 1 A at 20 ns.

3. The test board of claim 2, wherein the first voltage is a ground voltage.

4. The test board of claim 2, wherein the second voltage is a stress voltage having a value equal to or higher than 15 kV.

5. The test board of claim 1,
wherein the first switch connects the first test terminal to the ground terminal or the power terminal, and
wherein the second switch connects the second test terminal to the ground terminal or the power terminal.

6. The test board of claim 1, wherein the test terminal group is arranged on the substrate along a periphery of the mounting pad.

7. The test board of claim 1, wherein the semiconductor chip further comprises a ground line that connects the first terminal and the second terminal to each other.

8. A test board for a semiconductor device, comprising:
a substrate;
a mounting pad which is formed on the substrate and on which a semiconductor chip is mounted;
a test terminal group arranged on the substrate to be spaced apart from the mounting pad and electrically connected to the semiconductor chip by a pattern arranged on the substrate,
wherein:
the semiconductor chip includes a first terminal and a second terminal configured to input/output signals,
the test terminal group includes a first test terminal electrically connected to the first terminal and a second test terminal electrically connected to the second terminal,
both the first terminal and the second terminal are configured to receive a first voltage,
the first test terminal is configured to receive a stress signal that is caused by a second voltage,
the semiconductor chip further comprises a first inverter connected to the first terminal and a second inverter connected to the second terminal to receive a signal from the first inverter, and
the stress signal is provided to the first terminal and is transferred to the second inverter.

9. The test board of claim 8, wherein the semiconductor chip further comprises a connection line that connects the first inverter and the second inverter to each other.

10. A test system of a semiconductor device, comprising:
an electrostatic discharge (ESD) simulator including an RC equivalent circuit model to generate a stress signal;
a test board configured to receive the stress signal from the ESD simulator; and
an analyzer configured to monitor the test board,
wherein the test board includes:
a substrate;
a mounting pad on which a semiconductor chip that includes a first terminal and a second terminal is mounted; and
a first test terminal and a second test terminal arranged on the substrate and respectively connected to the first terminal and the second terminal of the semiconductor chip,
wherein both the first terminal and the second terminal are configured to receive a ground voltage, and
the semiconductor chip is configured to receive the stress signal through the first test terminal.

11. The test system of claim 10, wherein internal resistance of the RC equivalent circuit is between 5 kΩ to 10 kΩ and internal capacitance thereof is between 100 pF to 150 pF.

12. The test system of claim 10, wherein the analyzer is configured to monitor whether current that is output to the second terminal is increased by the stress signal.

13. The test system of claim 12, wherein:
the semiconductor chip comprises a first inverter electrically connected to the first terminal and a second inverter configured to receive an output of the first inverter,
the first inverter includes a first PMOS transistor connected to a supply voltage and a first NMOS transistor connected to the first terminal, and
the second inverter includes a second PMOS transistor connected to the supply voltage and a second NMOS transistor connected to the second terminal.

14. The test system of claim 13, wherein current that is output to the second terminal is leakage current of the NMOS transistor caused by the stress signal.

15. The test system of claim 10, wherein the test board further comprises:
a first terminal to which a supply voltage is applied;
a second terminal to which the ground voltage is applied;
a first switch configured to alternatively connect the first test terminal to the first terminal or the second terminal; and
a second switch configured to alternatively connect the second test terminal to the first terminal or the second terminal.

16. The test system of claim 13, wherein:
the first inverter and the second inverter are connected to each other by a connection line, and
one end of the connection line is connected to drain terminals of the first PMOS transistor and the first NMOS transistor of the first inverter and the opposite end of the connection line is connected to gate terminals of the second PMOS transistor and the second NMOS transistor of the second inverter.

17. The test system of claim 13, wherein:
the ground line connects the first terminal and the second terminal of the semiconductor chip is connected to each other by a ground line, and
one end of the ground line is connected to a source terminal of the first NMOS transistor and the opposite end of the ground terminal is connected to a source terminal of the second NMOS transistor.

* * * * *